United States Patent
Baldwin et al.

(10) Patent No.: US 10,366,987 B2
(45) Date of Patent: Jul. 30, 2019

(54) METHODS AND APPARATUS FOR COMPENSATION AND CURRENT SPREADING CORRECTION IN SHARED DRAIN MULTI-CHANNEL LOAD SWITCH

(71) Applicant: Texas Instruments Incorporated, Dallas, TX (US)

(72) Inventors: David J. Baldwin, Allen, TX (US); Hector X. Roman, Dallas, TX (US); Md. Abidur Rahman, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 354 days.

(21) Appl. No.: 15/211,450

(22) Filed: Jul. 15, 2016

(65) Prior Publication Data

US 2017/0030948 A1    Feb. 2, 2017

Related U.S. Application Data

(60) Provisional application No. 62/199,717, filed on Jul. 31, 2015.

(51) Int. Cl.
| | |
|---|---|
| *H01L 27/088* | (2006.01) |
| *G01R 19/00* | (2006.01) |
| *H03K 17/08* | (2006.01) |
| *H03K 17/14* | (2006.01) |
| *H01L 29/78* | (2006.01) |

(52) U.S. Cl.
CPC ........ *H01L 27/088* (2013.01); *G01R 19/0092* (2013.01); *H03K 17/08* (2013.01); *H03K 17/145* (2013.01); *H01L 29/7802* (2013.01)

(58) Field of Classification Search
CPC .............. H01L 27/088; H01L 29/7802; G01R 19/0092; H03K 17/08
USPC ........................................................ 324/140 R
See application file for complete search history.

(56) References Cited

U.S. PATENT DOCUMENTS

| 7,187,033 B2 | 3/2007 | Pendharkar | |
|---|---|---|---|
| 2008/0204958 A1* | 8/2008 | Shearon | H02H 3/18 361/93.9 |
| 2011/0062927 A1* | 3/2011 | Nagasawa | H02M 3/156 323/282 |

* cited by examiner

*Primary Examiner* — Melissa J Koval
*Assistant Examiner* — Courtney G McDonnough
(74) *Attorney, Agent, or Firm* — Lawrence J. Bassuk; Charles A. Brill; Frank D. Cimino

(57) ABSTRACT

Described example embodiments include an integrated circuit having a first channel area with a first FET formed in a semiconductor substrate, the substrate providing a contact to the drain. A second channel area includes a second FET formed in the semiconductor substrate. A pilot FET couples to the first FET in a current mirror configuration. A third FET has a conductivity opposite the first and second FETs and couples to the source of the pilot FET. An op amp includes an output coupled to the gate of the third FET. Signals from the drain of the second FET and the source of the pilot FET couple to the inverting input of the op amp. Signals from the source of the first FET and the drain of the first FET couple to the non-inverting input of the op amp. Methods and additional apparatus are disclosed.

18 Claims, 10 Drawing Sheets

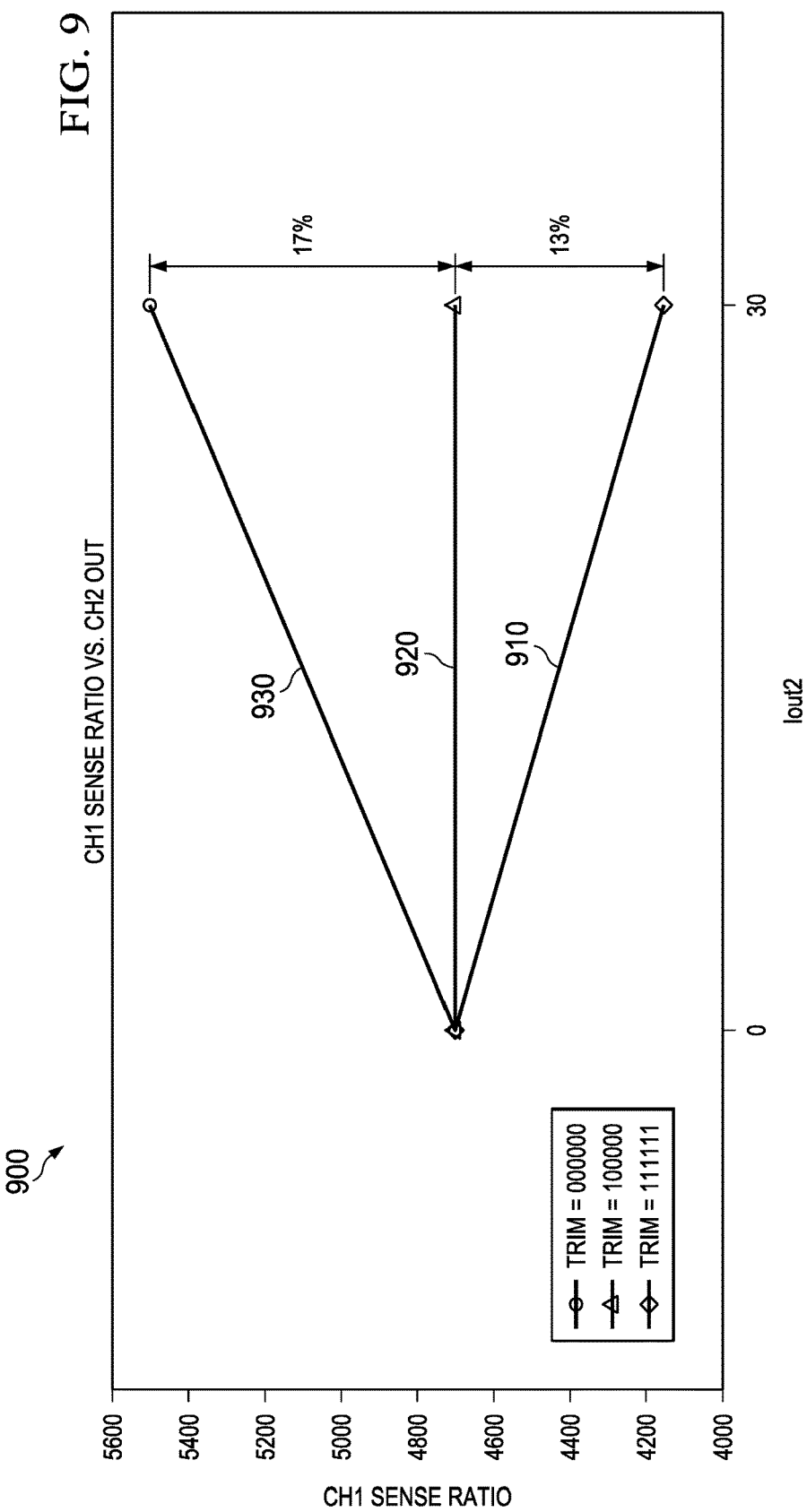

METHODS AND APPARATUS FOR COMPENSATION AND CURRENT SPREADING CORRECTION IN SHARED DRAIN MULTI-CHANNEL LOAD SWITCH

CROSS-REFERENCE TO RELATED APPLICATIONS

This application claims the benefit of priority under 35 U.S.C. § 119(e) to co-owned U.S. Provisional Patent Application Ser. No. 62/199,717, filed Jul. 31, 2015, entitled "Compensation Circuit for Current Spreading Correction in Shared Drain Multi-Channel Load Switch," naming David J. Baldwin et. al. as inventors, which is hereby incorporated by reference in its entirety herein.

TECHNICAL FIELD

This application relates generally to power metal oxide semiconductor field effect transistors (MOSFETs) and methods for operating power MOSFETs, and, in particular, circuitry and methods to accurately sense current in vertically oriented power MOSFETs formed in a common substrate.

BACKGROUND

In many applications for power MOSFETs, it is important to accurately determine the current being carried by the MOSFET. For example, when power MOSFETs supply current to the headlights of an automobile, it is necessary to know how much current the headlights are drawing to determine if there is a malfunction.

In one example configuration of power MOSFETs, two or more power MOSFETs are on a single integrated circuit die formed on a semiconductor substrate. In this configuration, a portion of the semiconductor substrate serves as the drain contact. One configuration of this type of vertical MOSFET is the NexFET™ devices available from Texas Instruments Incorporated, the assignee of this application. To provide the necessary current capacity, multiple MOSFETs are in a channel and are connected in parallel. To detect the current carried in the MOSFET channel, one smaller MOSFET, a pilot field effect transistor (FET) or sense FET is connected to the power MOSFETs in a current mirror configuration. A current sense output coupled to the current flowing in the pilot FET receives current proportional to the current flowing in the power MOSFETs. The sensed current is available for use by the system. However, when one MOSFET channel in a multichannel power FET integrated circuit is drawing a great deal of current, the current for that channel may also flow through a portion of the common drain used by the other MOSFET channels. This is referred to as "current spreading." Current spreading in a shared drain MOSFET can lead to inaccurate current measurement results, among other problems.

SUMMARY

In an example embodiment, an integrated circuit includes a first channel area having at least a first FET formed in a semiconductor substrate having at least one source, at least one gate and a drain, the semiconductor substrate providing a contact to the drain. A second channel area includes a second FET formed in the substrate having at least one source, at least one gate and a drain, the substrate providing a contact to the drain. A pilot FET in the first channel area has a drain coupled to the drain of the first FET, a gate coupled to the gate of the first FET, and a source. A third FET has a conductivity type opposite the first and second FETs, and has a source coupled to the source of the pilot FET, a gate, and a drain coupled to a current sensing output terminal. An op amp includes an output coupled to the gate of the third FET, an inverting input and a non-inverting input. A first resistor has a first terminal coupled to the drain of the second FET and a second terminal coupled to the inverting input of the op amp. A second resistor has a first terminal coupled to the source of the pilot FET and a second terminal coupled to the inverting input terminal of the op amp. A third resistor has a first terminal coupled to the source of the first FET and a second terminal coupled to the non-inverting input of the op amp. A fourth resistor has a first terminal coupled to the drain of the first FET and a second terminal coupled to the non-inverting input of the op amp. The impedance of the third FET can be modulated responsive to the output of the op amp to adjust a sense current flowing to the current sense output terminal.

BRIEF DESCRIPTION OF THE DRAWINGS

FIG. 9 is a graph of a simulation showing the effects of trimming a resistor in the circuit of FIGS. 7 and 8.

DETAILED DESCRIPTION OF EXAMPLE EMBODIMENTS

The structure, manufacture and use of example embodiments are discussed in detail herein. The various embodiments provide many applicable inventive concepts that can be arranged in a wide variety of specific contexts. The specific embodiments discussed herein are merely illustrative, and do not limit the scope of the application or of the appended claims.

Corresponding numerals and symbols in the different figures generally refer to corresponding parts unless otherwise indicated. The figures are not necessarily drawn to scale. The term "coupled" may include connections made with intervening elements, and additional elements and various connections may exist between any elements that are "coupled."

Figure 1A:
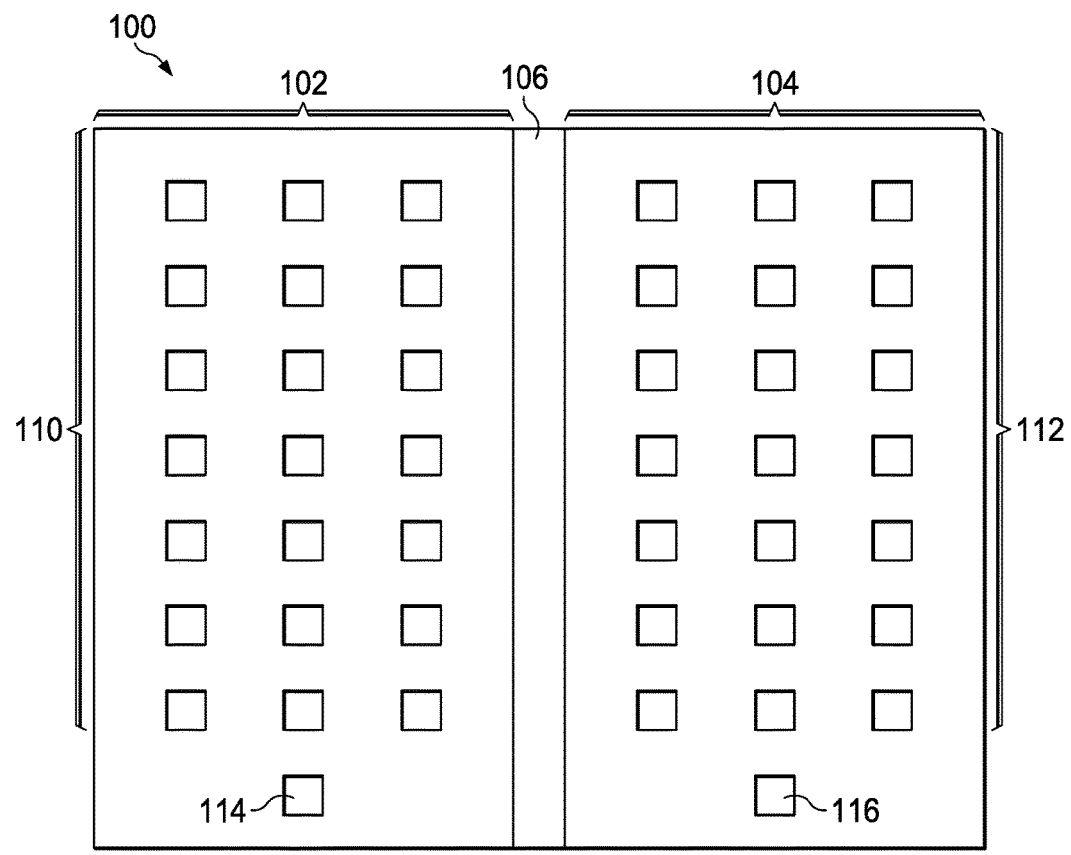
FIGS. 1A, 1B and 1C are views of a multichannel power MOSFET.
Figure 1B:
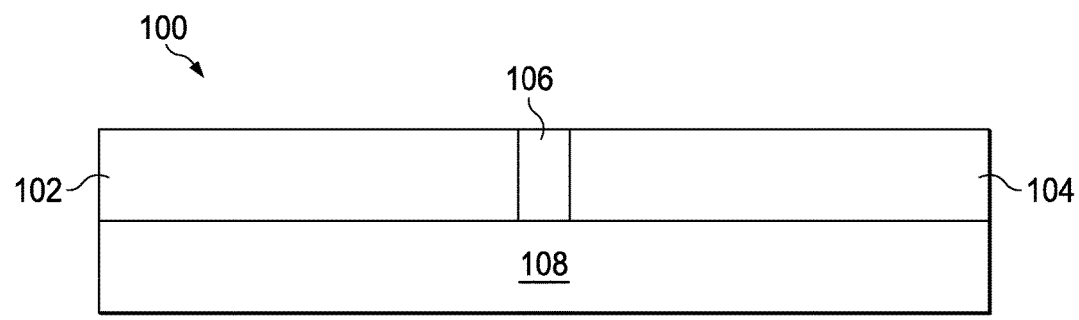
Figure 1C:
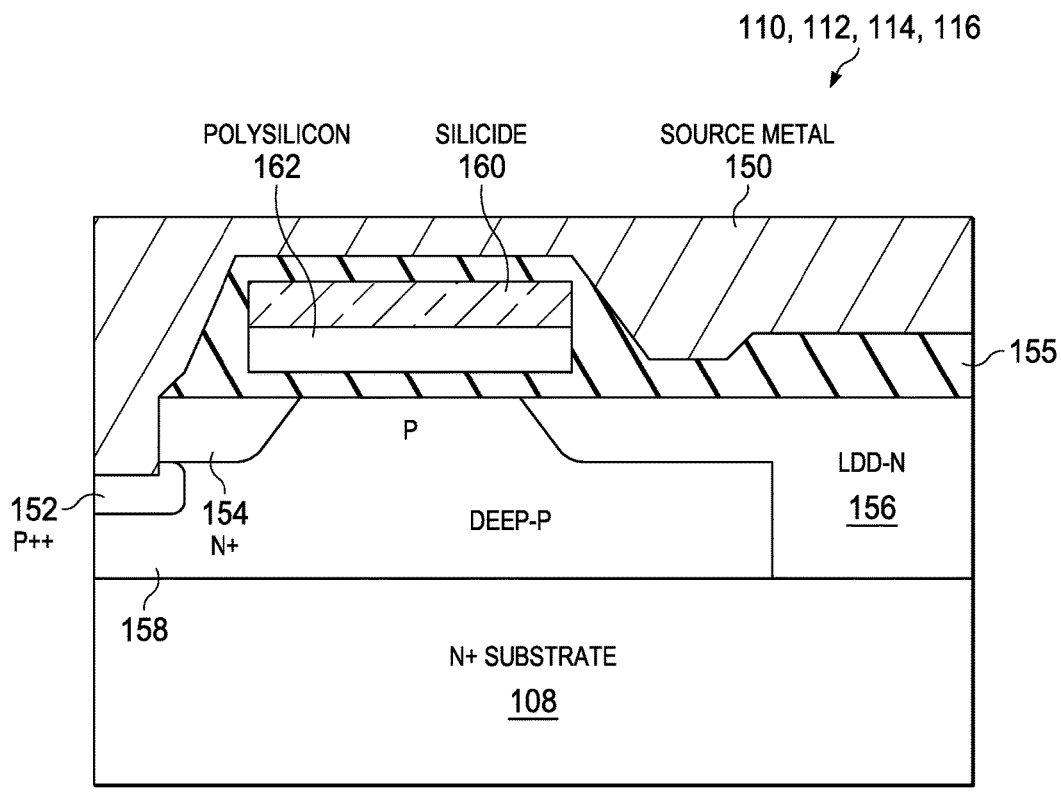

FIGS. 1A and 1B are a top view diagram and a cross-sectional view diagram, respectively, of a two-channel power MOSFET 100. FIG. 1C is a cross-sectional view diagram of a NexFET™ transistor that can be used in FIGS. 1A and 1B. As shown in FIG. 1A, field oxide region 106 separates MOSFET 102 from MOSFET 104, which form two separate channels. Each MOSFET includes one or more driving MOSFETs. For example, MOSFET 102 includes a plurality of driving MOSFETs 110. The number of driving MOSFETs can vary with the current capacity of the MOSFET, and can range from a few to thousands of transistors connected in parallel. As with MOSFET 102, MOSFET 104 includes one or more driving MOSFETs 112. MOSFETs 110 and 112 can be formed using NexFET™ devices, but MOSFETs 110 and 112 can also be formed by any of a number of known vertical FET implementations. The first channel including MOSFET 102 also includes a pilot FET 114 that monitors the current carried by MOSFET 102, as is more fully explained hereinbelow. Similarly, the second channel with MOSFET 116 includes pilot FET 116. Transistors 114 and 116 are shown positioned at the bottom of regions 102 and 104 in FIG. 1A, respectively, for clarity. In actual devices, pilot FETs 114 and 116 are placed on the semiconductor substrate to provide the most accurate current measurements. Experiments or circuit simulations can determine the best positions for these pilot FETs.

FIG. 1B is a cross-sectional view of two channel power MOSFET 100. As shown in FIG. 1B, field oxide region 106 separates the active region of channel 1, MOSFET 102, from the active region of channel 2, MOSFET 104. Field oxide can form region 106, as shown in this example. In alternative examples, other insulation materials for semiconductor devices can be suitably utilized, such as silicon nitride, silicon oxynitride, and trench isolation materials. Substrate 108 contacts the active regions of both channel 1 MOSFET 102 and channel 2 MOSFET 104. Substrate 108 serves as a drain contact for channel 1 MOSFET 102 and for channel 2 MOSFET 104. In an application, substrate 108 can be coupled to a supply voltage, as is explained hereinbelow. In an example, a battery is coupled to substrate 108 to supply current to the MOSFETs in channel 102 and channel 104.

FIG. 1C is a cross-sectional view of one of transistors 110, 112, 114 or 116. Silicide layer 160 and polysilicon layer 162 form the gate of the transistor, insulator 155 insulates the gate from the substrate and surrounds the gate. Source metal 150 contacts P++ region 152, which is a backgate contact to the channel region 158, which is a DEEP-P implant. Source metal 150 also contacts source 154. Source metal 150 overlies drain 158 and an insulator 155 to provide shielding and help avoid corner effects. Drain 156 contacts N+ substrate 108, which serves as a drain contact for all of transistors 110, 112, 114 and 116.

Figure 2:
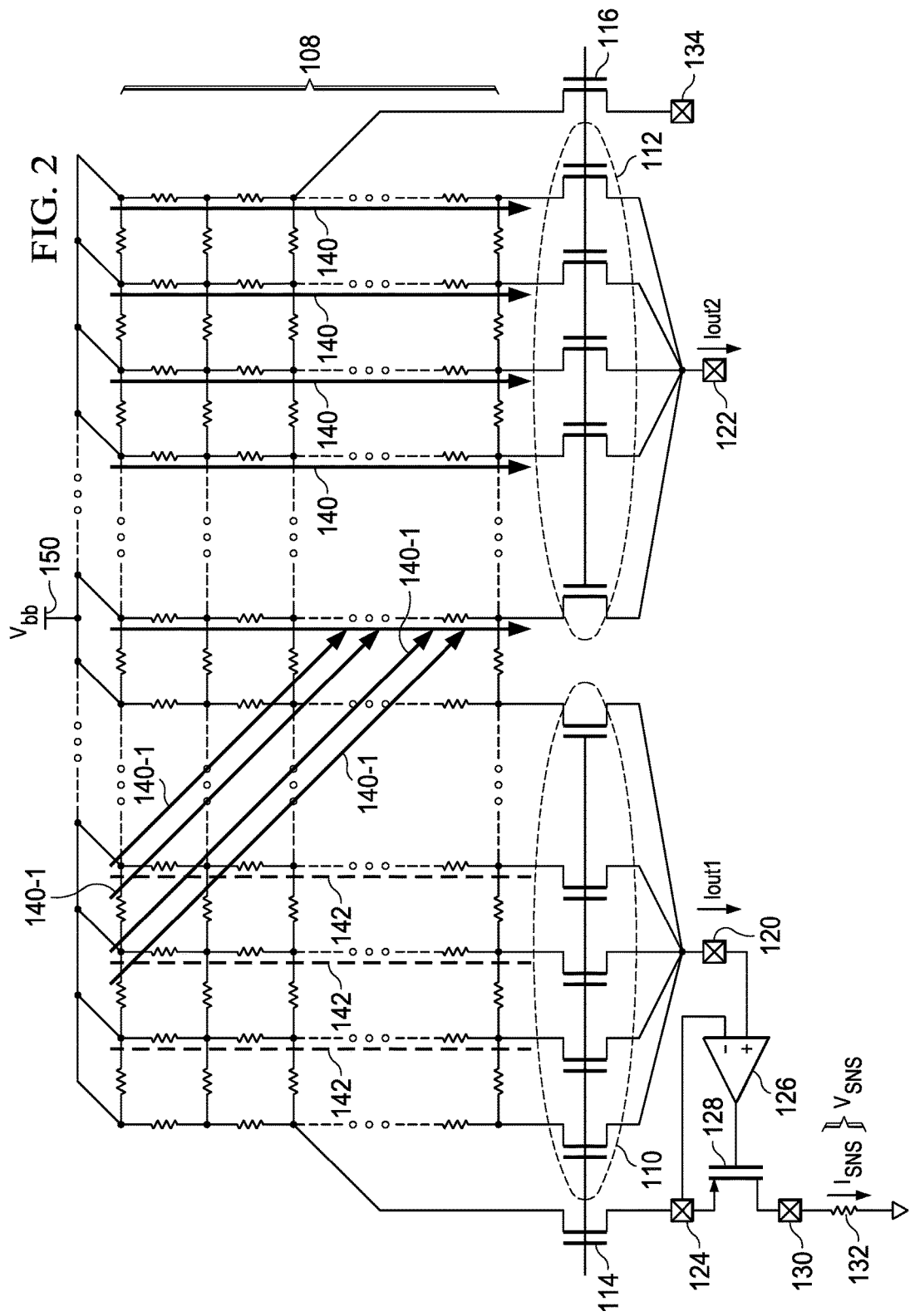
FIG. 2 is a circuit diagram of current measurement circuitry of the multichannel power MOSFET of FIGS. 1A and 1B.

FIG. 2 is a circuit schematic diagram of a two-channel power MOSFET 100. Substrate 108 is represented in FIG. 2 as a mesh of resistance elements coupled to a potential labeled $V_{bb}$ at terminal 150. $V_{bb}$ can be a battery supply voltage or other voltage for supplying voltage and current to a load. The resistive elements are shown arranged in a matrix fashion in FIG. 2. However, this is merely a schematic representation of the resistance of the bulk silicon (doped for conductivity). There is a resistance between any two points within substrate 108, not just in directions that are orthogonal to any reference point. The drains of transistors 110, 112, 114 and 116 are coupled to substrate 108. The gates of transistors 110 and 114 are coupled together and to a control terminal (not shown). Similarly, the gates of transistors 112 and 116 couple together and to another control terminal. Transistors 114 and 116 are the pilot FETs and couple in current mirror fashion to transistors 110 and 112, respectively. Scaling is used to reduce the amount of current needed in the current sensing circuitry and to allow smaller size pilot transistors to be used. Transistor 114 is scaled from transistor 110 by the scale factor "K", that is, transistor 114 is size 1/K multiplied by the size of transistor 110.

In an experimental device, an op amp 126 has an inverting input coupled to current sense output terminal 124, and a non-inverting input coupled to output terminal 120. The op amp output couples to the gate of p-channel FET 128. The source of FET 128 couples to terminal 124 and its drain is coupled to terminal 130. Resistor 132 is coupled between terminal 130 and ground to provide an output voltage proportional to the current flowing in the pilot FET 114. Op amp 126 compares the source voltage on transistors 110 and pilot FET 114 and provides an inverting feedback loop to stabilize the output. The output of transistor 128 is a current that is a fraction of the current passing through transistors 110. This fraction should be the same as the size of transistor 114 over the total size of all of transistors 110. The inverse of this fraction forms a channel sense ratio.

In operation, op amp 128 is in a feedback control loop between the source terminal of pilot FET 114 and the gate of transistor 128. A virtual ground circuit is formed at the non-inverting and inverting inputs of the op amp 126. Because the pilot FET 114 has a common gate connection with the transistors 110, and the drain voltage should be the same for both the pilot FET 114 and the transistor 110, the current flowing through the pilot FET 114 should be proportional to the current flowing through transistors 110. The pilot FET 114 has the same potential at its gate and drain terminals as the transistors 110, that is, the pilot FET 110 is a current mirror. The op amp 126 will change its output voltage, which controls the gate of transistor 128 and thus controls the voltage at node 124, to make the voltages at the non-inverting input and the inverting input equal.

Once the feedback control makes the source voltage for the pilot FET 114 equal to the source voltage for transistors 110, the drain to source voltage for the pilot FET 114 is expected to be equal to the drain to source voltage for the transistors 110, and since the two gate terminals are tied to a common control voltage, the drain to source current flowing through the pilot FET 114 is expected to be related to the current flowing in the main transistor 110, scaled by the scaling constant "K". The current $I_{SNS}$ can be sensed by using the resistor 132 to form a sense voltage $V_{SNS}$.

FIG. 2 will now be used to describe a current spreading effect. In an example operation, the transistors 112 are carrying a very high current 140. Also, in this example operation 2, the transistors 110 of channel 102 (FIG. 1A) are carrying a much smaller current labeled 142 in FIG. 2. In this circumstance, a portion of the current carried by transistors 112, labeled 140-1 in FIG. 2, will flow through a portion of the substrate 108 beneath channel 102 (see FIG. 1A). This current spreading can cause erroneous current measurements for transistors 110 by causing a voltage drop across the resistance of substrate 108. The voltage drop caused by the current 140-1 flowing through transistor 112 lowers the drain voltage of pilot FET 114, and thus lowers the drain to source voltage of pilot FET 114. Because this lower voltage is not caused by the current 142 flowing through transistors 110, the current spreading can cause erroneous current measurement results, as is further explained with regard to FIG. 3 hereinbelow.

Figure 3:
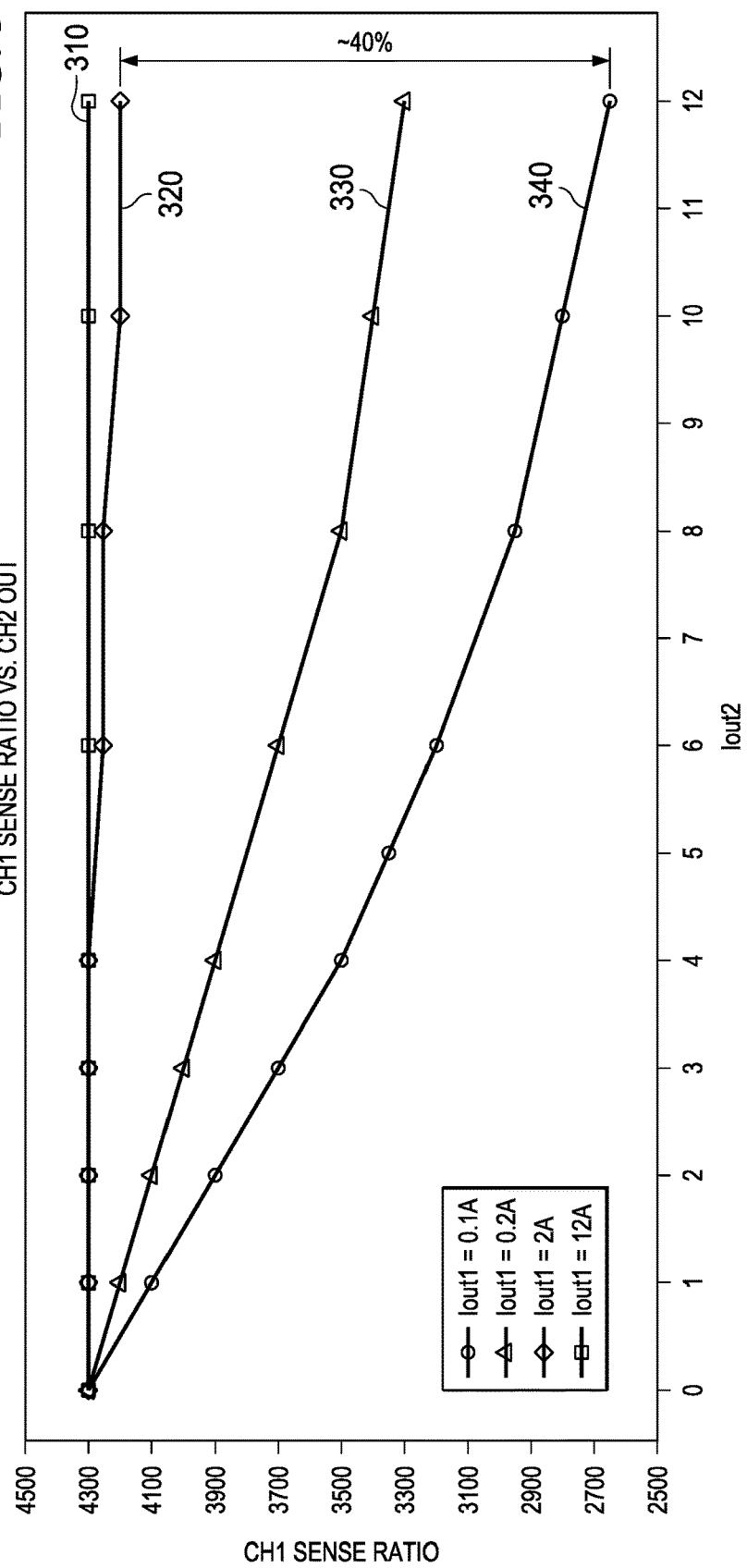
FIG. 3 is a graph of current measurement performance.

FIG. 3 is a graph showing experimental results using a two-channel power MOSFET 100. The horizontal axis plots current Iout2 measured at terminal 122 in FIG. 2, which is the current flowing through transistors 112 (see FIG. 2). The vertical axis plots the channel sense ratio for pilot FET 114 (see FIG. 2). The top data line 310 shows the channel sense ratio when the current through transistors 110 is 12 Amperes (A). This current is relatively high compared to current through transistors 112. Data line 310 illustrates that when channel 1 in region 102 (see FIG. 1) is drawing the high current, the channel sense ratio is approximately 4300, which is accurate for the sizing of pilot FET 114 and transistors 110 in this example. When the current flowing through channel 1 in region 102 is a high current, there is very little spreading current because the portion of substrate 108 that is coupled to channel 1 is providing almost all of its current to transistors 110. The approximately flat slope of data line 310, which remains around the channel sense ratio value 4300 for all of the data points for the current Iout2, illustrates the lack of current spreading for this condition.

However, for conditions with relatively lower current loading on transistors 110 (see FIG. 2), increased current spreading causes current measurement inaccuracies. In FIG. 3, data line 320 shows the channel sense ratio when the current Iout1 through transistors 110 (FIG. 2) is 2 Amps. Data line 330 shows the channel sense ratio when the current through transistors 110 (FIG. 2) is 0.2 Amps. Data line 340 shows the sense ratio when the current through transistors 110 (FIG. 2) is 0.1 Amps. For data line 340, when the current through the channel 2 transistors 112 (FIG. 2) is 12 Amps at the right hand side of FIG. 3, the current sense ratio is approximately 40% below 4300, which is the accurate current sense ratio. Spreading current from transistors 112 (FIG. 2) in channel 104 (FIG. 1) causes significant errors in the measurement of the current through transistors 110 (FIG. 2) by pilot FET 114 (FIG. 2). This measurement error is mostly due to the additional voltage drop of the spreading current through the substrate beneath channel 102 (FIG. 1). Under these conditions, the voltage at the drain of pilot FET 114 falls due to spread current that is flowing in transistors 112, and not transistors 110, which causes the current measurement error.

One method of addressing the current measurement error due to current spreading is to separate the substrate into two individual dies, one for each channel. This approach results in a larger packaged circuit size and is not desirable, as the various advantages of the shared drain substrate are lost. By providing a single semiconductor substrate, package size, package cost, heat dissipation, cost of manufacture and power are all improved. Another method of addressing the problem of spreading current is to use a thinner substrate for substrate 108. The use of a thinner substrate for the integrated die does not entirely eliminate the current measurement error problem, and a thinner substrate is also more fragile and less able to dissipate heat.

Figure 4:
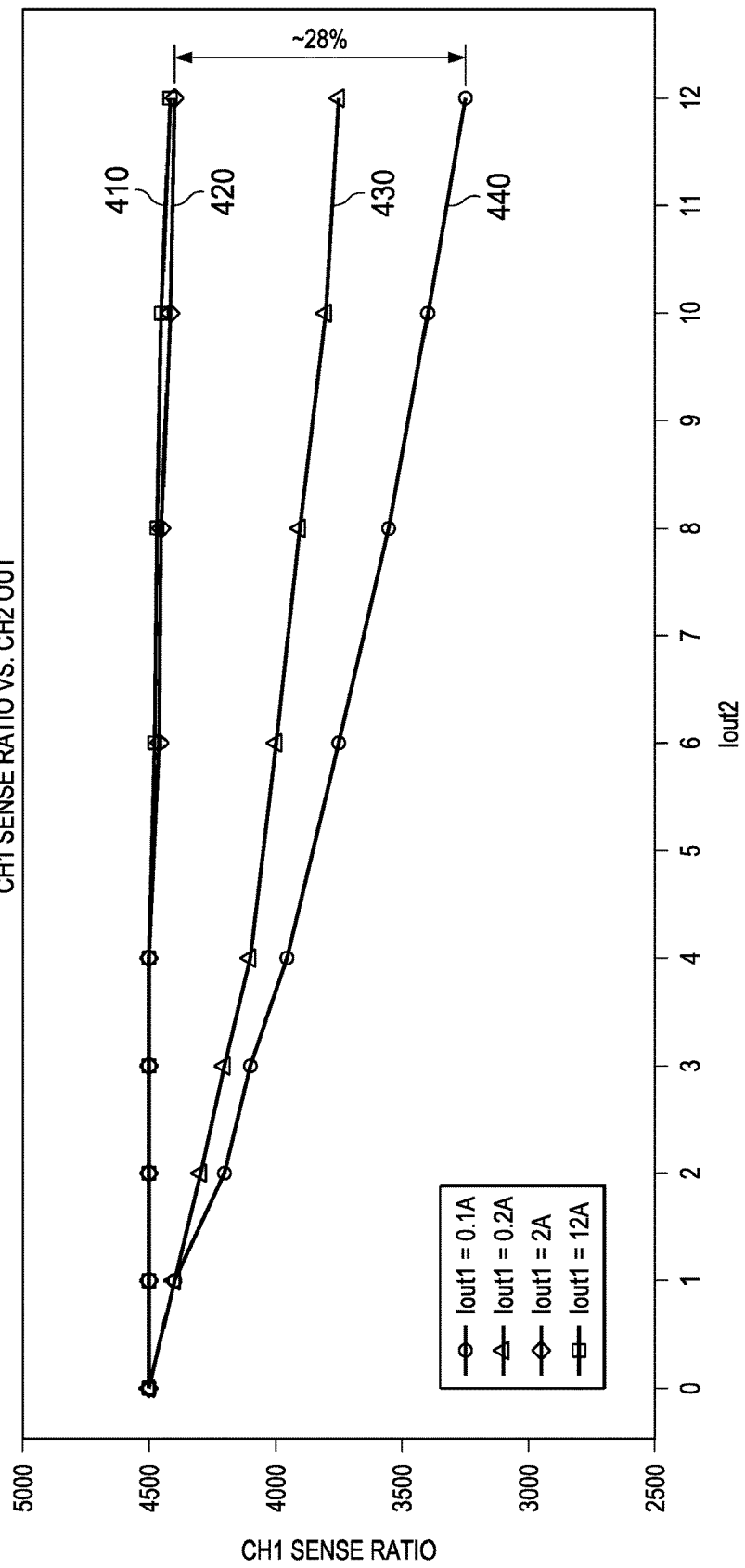
FIG. 4 is a graph of current measurement performance.

FIG. 4 shows the results of an experiment conducted with a thin substrate. Substrate 108 has a thickness of 15 mils in the experiment of FIG. 3. FIG. 4 is a graph showing results for the same experiment as shown in FIG. 3 but now conducted with a 4 mil thick substrate 108. The top data line 410 shows the channel sense ratio when the current Iout1 through transistors 110 is 12 Amperes (A). Data line 410 again illustrates that, when channel 102 is drawing a high current, the channel sense ratio is approximately 4300, which is accurate for the sizing of pilot FET 114 and transistors 110.

As was described above with respect to FIG. 3, for lower current loading on transistors 110 (see FIG. 2) relative to transistors 112, more current spreading occurs and that causes current measurement inaccuracies. In FIG. 4 data line 420 shows the channel sense ratio when the current Iout1 through transistors 110 (FIG. 2) is 2 A. Data line 430 shows the channel sense ratio when the current through transistors 110 (FIG. 2) is 0.2 A. Data line 440 shows the sense ratio when the current through transistors 110 (FIG. 2) is 0.1 A. For data line 440, when the current through transistors 112 (FIG. 2) is 12 A, the current sense ratio is still approximately 28% below 4300, which is the accurate sense ratio. Therefore, a thinner substrate improves the current measurement error slightly, but the error is still a considerable 28%.

Figure 5:
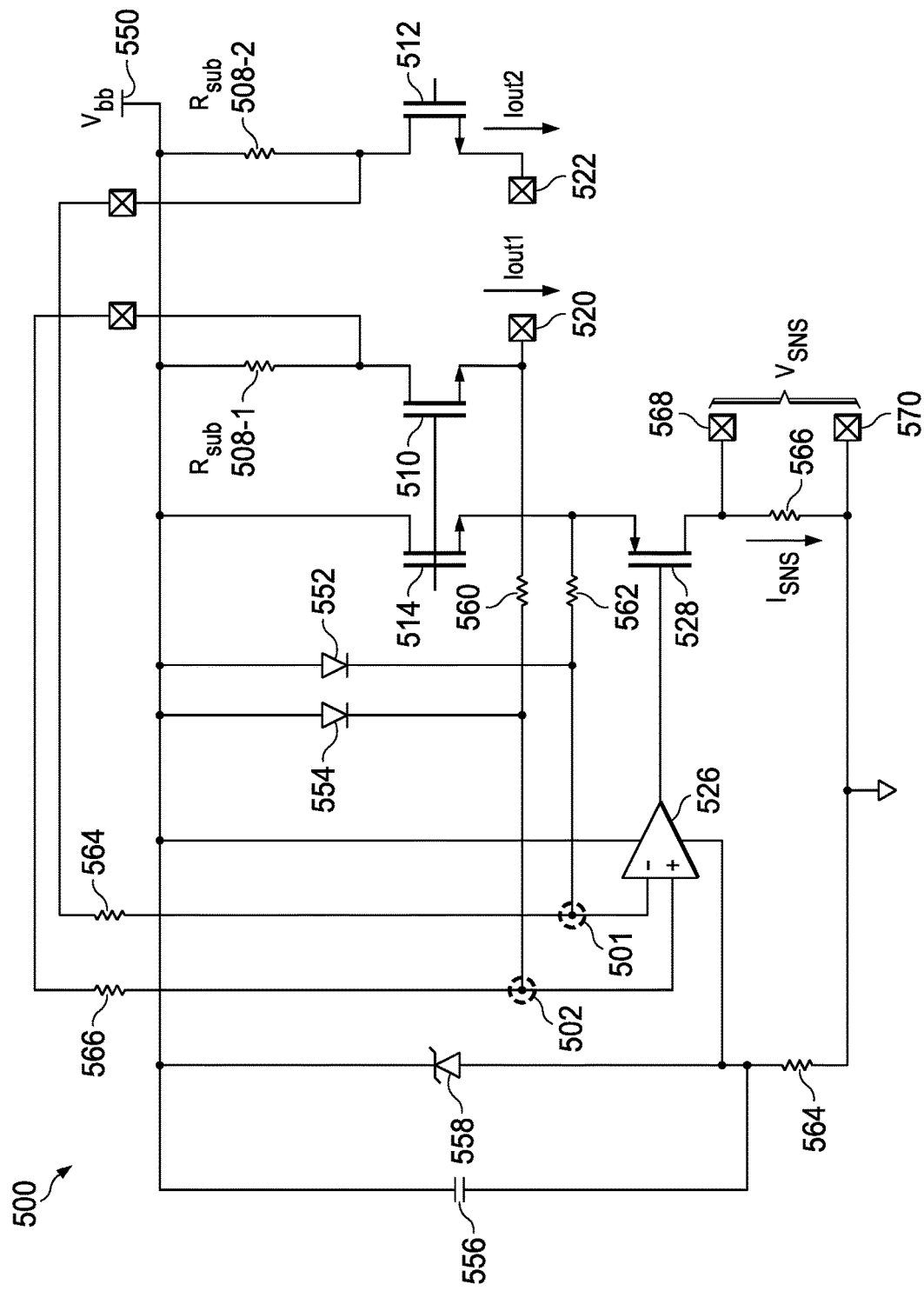
FIG. 5 is a circuit diagram of an emulation board embodiment.

FIG. 5 is a circuit diagram 500 of a circuit formed on an emulation board used to confirm the operation of an embodiment. The components shown in FIG. 5 are mounted on a printed circuit board to emulate an integrated circuit embodiment. Transistors 510 and 512 correspond to FETs 110 and 112 in FIG. 1. Resistors 508-1 and 508-2 represent the substrate resistance that exists between the drains of transistors 510 and 512, respectively, and a $V_{bb}$ terminal 550. Transistor 514 is the pilot FET for FET 510 and is coupled in a current mirror fashion to the transistor 510. The drain of transistor 514 directly connects to $V_{bb}$ 550. The source of transistor 514 couples to the source of p-channel transistor 528. The gate of transistor 528 couples to the output of op amp 526.

In operation, a voltage can be coupled to the terminal $V_{bb}$ to supply current to a load for one or both channels. As the output voltage of the op amp 526 rises, the impedance of transistor 528, a P-type FET device, also rises. The current sense output $I_{SNS}$ is provided from the drain of transistor 528 to a current sense output terminal 568. In FIG. 5, a sense resistor 566 is used to create a sensed voltage $V_{SNS}$. Current $I_{SNS}$ passes through resistor 566 and is measured by the voltage $V_{SNS}$ across resistor 566 at terminals 568 and 570. As the op amp 526 has a virtual ground at its input terminals, the output of the op amp will operate to make the voltage at the source terminal of the pilot FET 514 equal the voltage at the source terminal of transistor 510. When the drain to source voltage of the pilot FET 514 is equal to the drain to source voltage of the transistor 510, the current flowing through the sense resistor 566 will be proportional to the load current Iout1 flowing from terminal 520.

Still referring to FIG. 5, the source of transistor 510 couples to output terminal 520 where current Iout1 is output. Terminal 520 can be coupled to a load (not shown). The source of transistor 510 also couples to resistor 560. The other terminal of resistor 560 couples to a summing node 502 at the non-inverting input of op amp 526. The value of resistor 560 in this example embodiment is 20KΩ. The drain of transistor 510 also couples to summing node 502 through resistor 566. The value of resistor 566 in this embodiment is approximately 200KΩ, and thus is ten times the value of resistor 560. In alternative embodiments other resistor values can be used.

The inverting input of op amp 526 couples to a summing node 501. The summing node 501 couples to the source of pilot FET 514 through resistor 562. Because the source of transistor 514 is also coupled to the source of transistor 528, resistor 562 provides an inverting feedback path for stability. Also coupled to the summing node 501 at the inverting input of op amp 526 is the drain of transistor 512, which is coupled to the summing node 501 through resistor 564. In the example of FIG. 5, resistor 562 has a value of 20KΩ and resistor 564 has a value of 200KΩ. The ratio between resistor 564 and resistor 562 is therefore ten to one. Diodes 554 and 552 operate to prevent an overvoltage condition on the inputs of op amp 526. Zener diode 558, capacitor 556 and resistor 564 condition the power supply to op amp 526.

In operation, if a condition exists in circuit 500 where a large current Iout2 is passing through transistor 512 while a small current Iout1 is passing through transistor 510, then there will be a significant voltage drop across $R_{sub}$ 508-2. In this condition, current spreading can occur. The voltage drop across $R_{sub}$ 508-2 lowers the voltage on the inverting input to op amp 526 through resistor 564 coupled to the summing node 501. In response to the lowered voltage, the op-amp 526 then raises the voltage on the gate of transistor 528, which raises the source to drain impedance of transistor 528. The increased impedance of transistor 528 lowers the current sensing output $I_{SNS}$. Referring back to FIG. 3, the experiment in FIG. 3 shows that without compensation the channel sense ratio can be too low by up to 40%. The channel sense ratio is the current through the channel transistors divided by the current sensing output. By operation of the compensation circuitry of FIG. 5, the current at the current sensing output is lowered during current spreading. This lowered current raises the channel sense ratio and thus corrects for current spreading effects.

However, if instead of a low current there is significant current Iout1 flowing through transistors 510 while significant current flows through transistors 512, the effect of current spreading on the drain voltage of pilot FET 514 is small. This can be seen by referring again to data line 310 in FIG. 3, for example. In this condition current sense compensation is not needed. Referring to FIG. 5, the drain of transistor 510 couples to the summing node 502. Summing node 502 is coupled to the non-inverting input of op amp 526 through resistor 566. If the voltage drop across resistance 508-1 is high, this increased voltage drop lowers the voltage at the non-inverting input of op amp 526, and thus lowers the output of the op amp 526. The lowered voltage at the non-inverting input of op amp 526 thus offsets the lowered voltage at the inverting input of op amp 526 from the drains of transistors 512 via resistor 564. Therefore, the correction of circuit 500 is not applied when both transistors 510 and 512 are drawing large currents. The amount of correction applied by circuit 500 is dependent upon the ratios of resistors 564 and 566 to resistors 562 and 560, respectively.

Because the non-inverting input and inverting input of the op amp 526 are each coupled to summing nodes 501, 502 that include the drain voltages of the main transistors 510, 512 in the dual channels, the current spreading error can be compensated. The two drain voltages are coupled to opposite terminals of the op amp, and so the differential between the two drain voltages is compensated for by the differencing operation of the op amp. When both channels have high current flow, there is no significant current spreading. In this condition the difference between the drain voltages is small and no compensation is provided. When the current through transistor 512 is high and the current through transistor 510 is lower, the difference is greater at the inputs to the op amp, and the compensation will be applied by the feedback operation of op amp 526.

Figure 6:
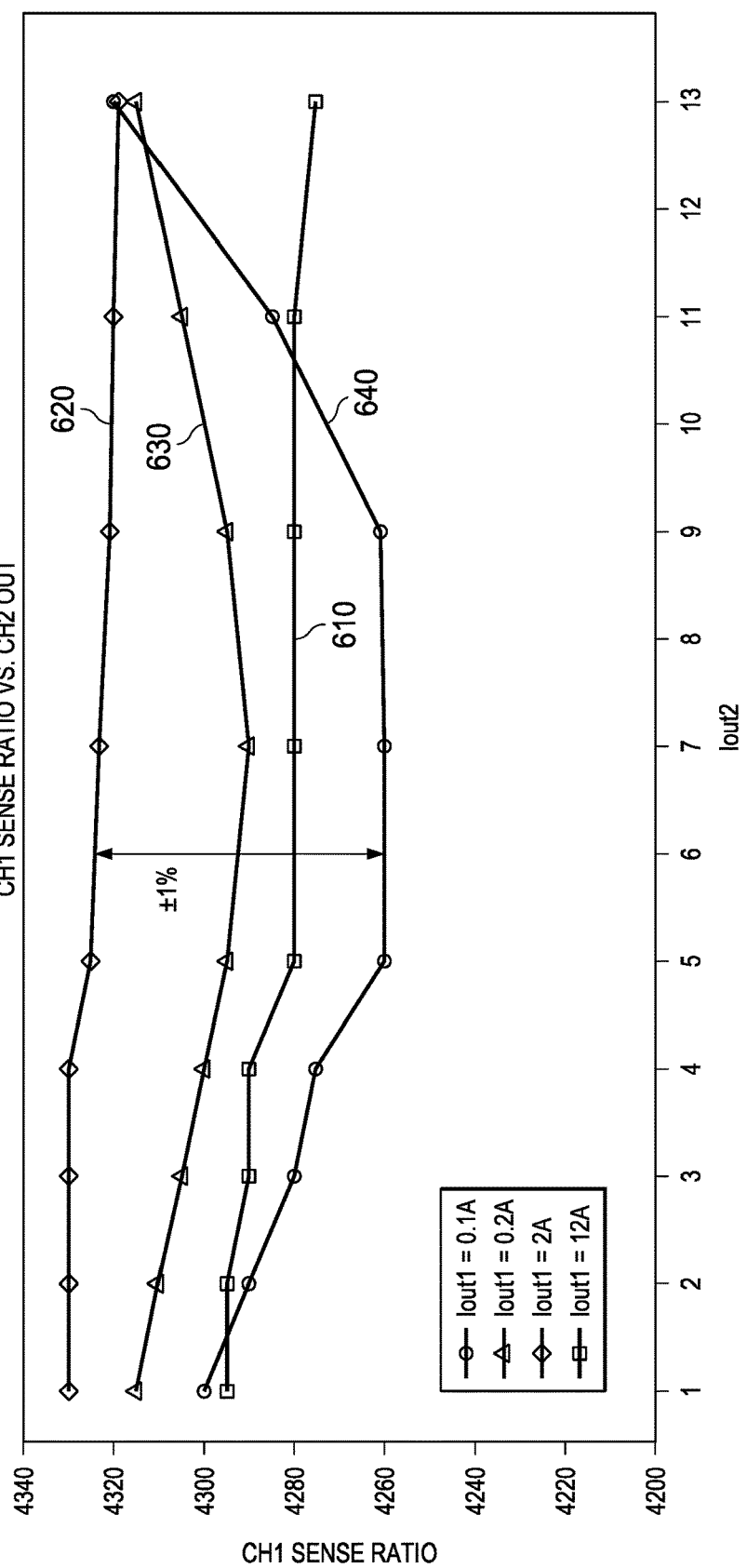
FIG. 6 is a graph of current measurement performance of the circuit of FIG. 5.

FIG. 6 is a graph illustrating the performance of an experimental device that implemented circuit 500. In FIG. 6, current is plotted in amperes (A) on the horizontal axis and the channel sense ratio for channel 1 (labeled "CH1 Sense Ratio") is plotted on the vertical axis. Current Iout2 flowing through transistors 512 varied from 1 to 12 A, as in the graphs of FIGS. 3 and 4 hereinabove. Data line 610 shows the channel sense ratio when the current through transistors 510 (FIG. 5) is 12 A. Data line 620 shows the channel sense ratio when the current through transistors 510 (FIG. 5) is 2 A. Data line 630 shows the channel sense ratio when the current through transistors 510 (FIG. 5) is 0.2 A. Data line 640 shows the channel sense ratio when the current through transistors 510 (FIG. 5) is 0.1 A. As shown in FIG. 6, the channel sense ratio error obtained for the embodiment circuit 500 has a maximum of approximately 1% (note that the vertical scale is from 4200 to 4340, which is much smaller than the vertical scale in FIGS. 3 and 4). The results of the experiment plotted in FIG. 6 show that the compensation circuitry of the embodiment of FIG. 5 effectively corrects for current measurement errors caused by current spreading.

Figure 7:
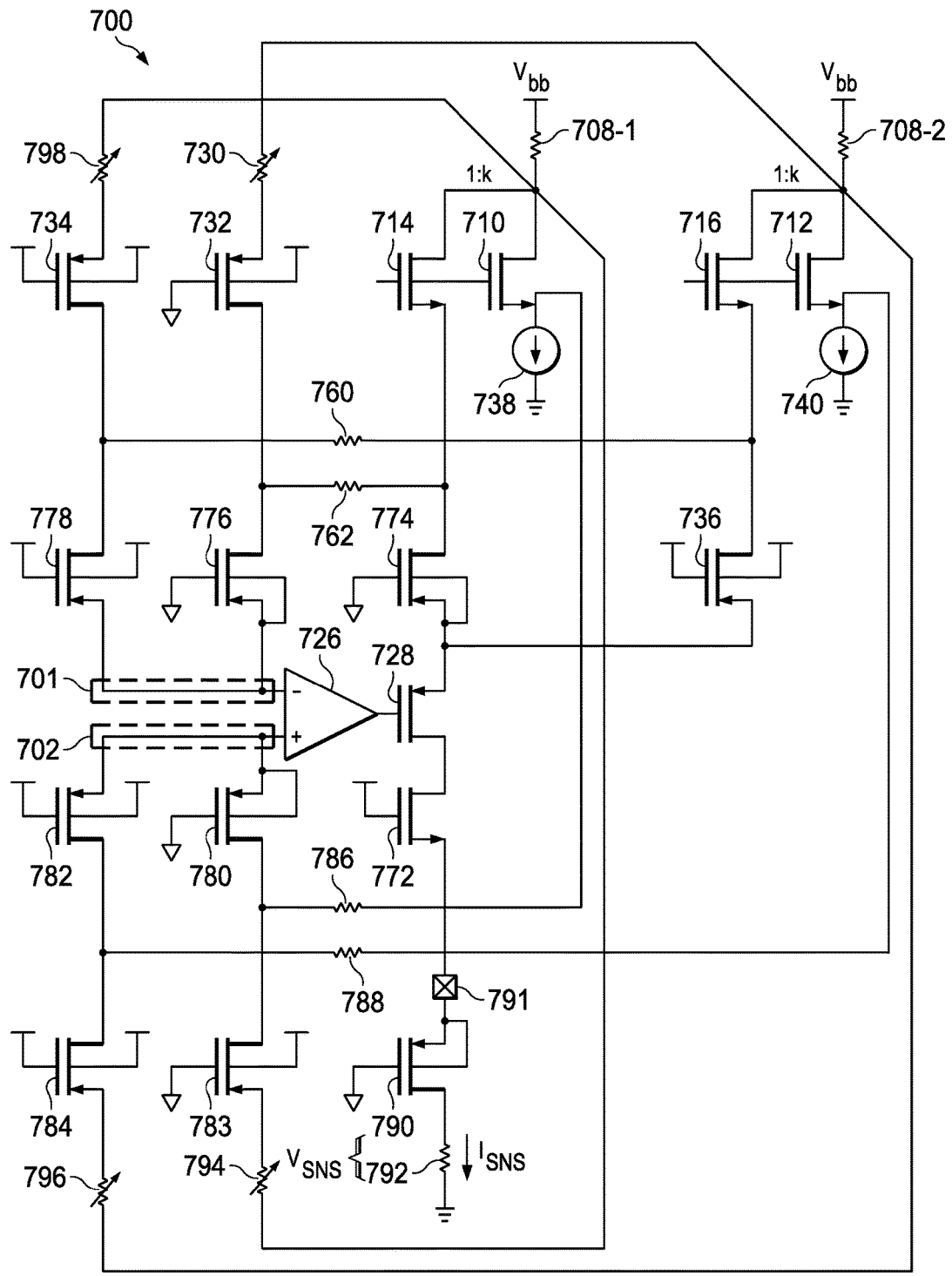
FIG. 7 is a circuit diagram of an embodiment.

FIG. 7 is a circuit diagram of an embodiment. Circuit 700 is included on the same substrate that includes channel 1 FETs 710 and channel 2 FETs 712 (which correspond to transistors 110 and 112, respectively, in FIG. 1). Transistors 710 provide current to load 738 and transistors 712 provide current to load 740. Pilot FET 714 measures the current in transistors 710. Pilot FET 716 measures the current in transistors 712. Transistors 732, 734, 736, 774, 776, 778, 782, 780, 783 and 784 in this example embodiment are extended drain transistors, as indicated by the heavy lines shown on the drains of each of these transistors. Example extended drain transistors are described in U.S. Pat. No. 7,187,033, entitled "Drain-extended MOS transistors with diode clamp and methods for making the same," which is assigned to the assignee of this application and which is incorporated in its entirety herein by reference. Use of the extended drain transistors for transistors 732, 734, 736, 774, 776, 778, 782, 780, 783 and 784 is to protect other sensitive devices from voltage and current spikes. However, in an alternative arrangement other transistor types can be used. Further, the use of these transistors enables sharing of the current sense circuitry including the op amp 726, transistor 728, and sense resistor 792 so that current sensing can be selectively done for either FET 710 (which can be formed of multiple transistors as in FIG. 1A) or FET 712 using pilot FETs 714 and 716 in a switchable configuration. By disabling the transistors 734, 778, 782, 784 and 736 while enabling transistors 774, 732, 776, 778, and 783 (as shown in FIG. 7), the current is sensed for transistors 710 using pilot FET 714. By instead enabling transistors 734, 778, 782, 784 and 736 while disabling transistors 774, 732, 776, 7780, and 783 (not shown in FIG. 7, for clarity), current can be sensed for transistors 712 using pilot FET 716. The gate terminals of the transistors switchably control which ones are active. As an alternative embodiment, a dedicated current sensing circuit including an additional op amp, additional p-channel FET, and an additional second sense resistor can be used to provide a current sense circuit for each of the pilot FETs 714, 716. In this alternative arrangement, switching circuitry is not needed.

Circuit 700 provides current spreading compensation for the measurement of current in either channel 1 (transistors 710) or channel 2 (transistors 712). For example, when the current in channel 1 is being measured as is shown in FIG. 7, the drains of transistors 712 are coupled through trimmable resistor 730 and transistor 732 and 776 to summing node 701. Summing node 701 couples to inverting input of op amp 726. In this example, the drains of transistors 710 are disconnected from the op amp 726 by disabling transistors 734 and 778. Therefore, the drains of transistors 710 are not coupled to the inverting input of op amp 726. Similarly, the sources of transistors 710 are coupled to the summing node 702 through resistor 786 and transistor 780, and to the non-inverting input of op amp 726. The sources of transistors 712 are not coupled to the non-inverting input of op amp 726 through resistor 788 because in this example, transistor 782 is disabled.

Continuing to refer to FIG. 7, the source of pilot FET 714 is coupled to the source of p-channel transistor 728 through transistor 744 and is also coupled to the summing node 701 via resistor 762, and by transistor 776. However, the source of pilot FET 716 is not coupled to the drain of transistor 728 because transistor 736 is disabled in FIG. 7. In addition, the source of pilot FET 716 is not coupled to the inverting input of op amp 726 via resistor 760 because transistor 778 is disabled in FIG. 7.

In FIG. 7, the signals coupled from the substrate resistors 708-1, 708-2 can be scaled to be comparable in value to the signals obtained from the source terminals of the main FETs 710, 712 and the pilot FETs 714, 716. Scaling can be done by using ratios for certain resistors. The trimmable resistors such as 730, 798 can be sized to be N times larger than the resistors 760, 762 between the pilot FETs and the inverting node of the op amp. Resistors 730, 798 can be sized such that the equivalent on-resistances of the P-type transistors 732, 734 are negligible when compared to the adjustable resistor values. By sizing the resistors 732, 798 in this manner, these P-type devices do not introduce significant error into the ratio of resistors 730, 762 or the ratio of resistors 798, 760. The same sizing and ratio approach applies to resistors 794, 786 that are coupled to the second summing node 702, as well as to resistors 796, and 788. An additional feature of the embodiments is that the extended drain transistors such as 776, 780 are placed within the feedback network of the op amp, so that any error introduced by the on-resistance of these devices can also be compensated for by the op amp difference action at the inputs to the op amp. By adjusting the trimmable resistors in FIG. 7, the current measurement compensation can be adjusted to minimize the errors due to current spreading in the device. The resistor trimming can be done by testing after the device is manufactured.

Figure 8:
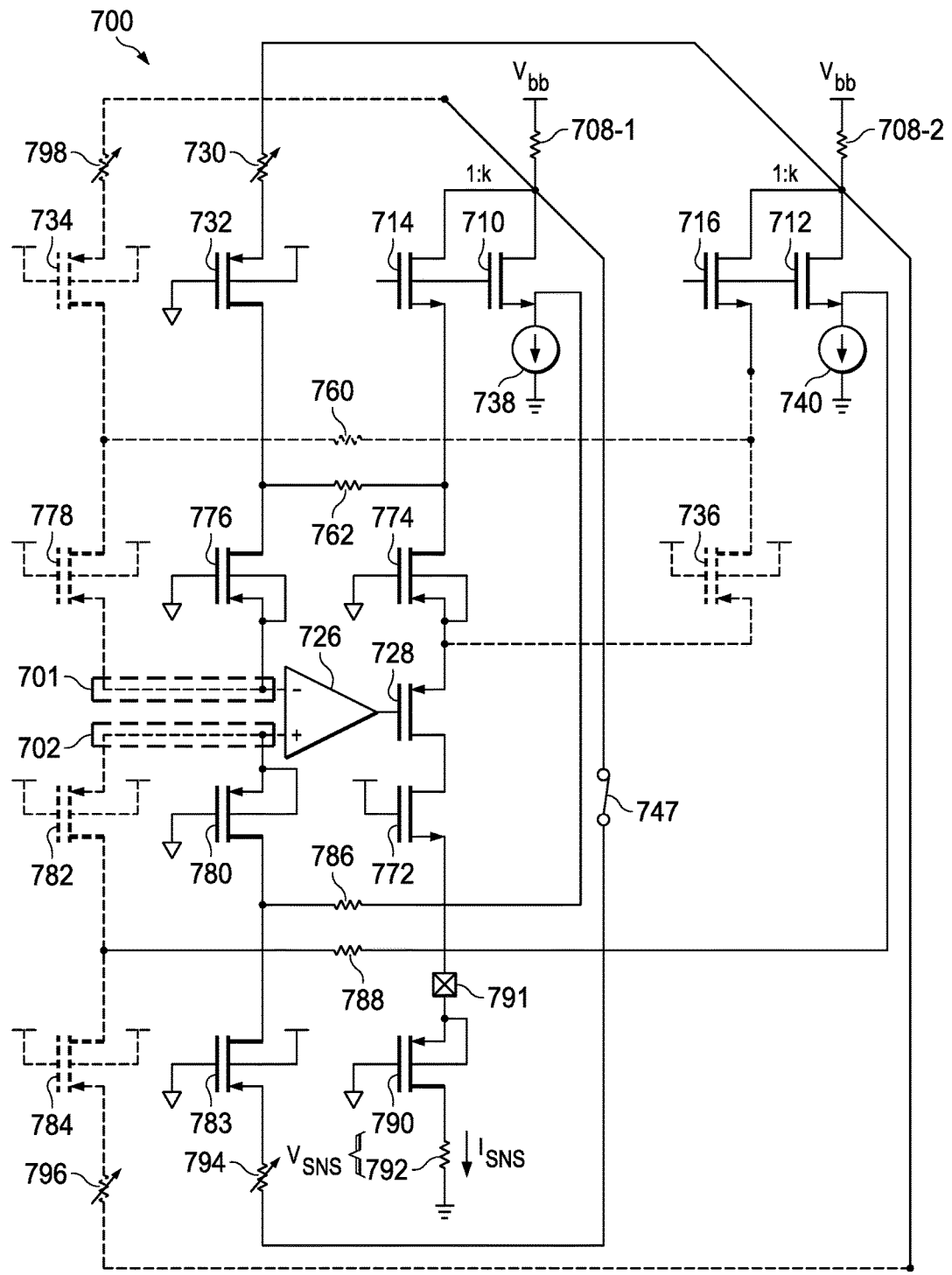
FIG. 8 is another circuit diagram of the embodiment of FIG. 7 showing operational aspects of the circuit.

The operation for the configuration of FIG. 7 is shown more clearly in FIG. 8. FIG. 8 is a schematic diagram of circuit 700 clearly showing the active devices and the inactive devices when the circuit is arranged to measure current in transistors 710 using pilot FET 714. The portion of circuit 700 shown in dashed lines is disconnected and disabled. The portion of circuit 700 shown in FIG. 8 with solid lines is coupled and enabled. By changing the gate voltages to enable transistors 736, 734, 778, 782, and 784, for example by use of a switch (not shown for clarity) to change the gate voltages for these transistors; and by changing the gate voltages to disable transistors 774, 732, 776, 780, and 783, the circuitry can be changed to sense current in transistors 712, using pilot FET 716. In FIG. 8 the drains of transistors 712 are coupled to the summing node 701 through resistor 730, and transistor 732 and 776. The summing node 701 is coupled to the inverting input of the op amp 726. This configuration provides compensation for spreading current errors in channel 1, main transistors 710 and pilot FET 714.

As explained hereinabove with regard to FIG. 5, a high current through substrate resistance 708-2 increases the voltage drop across substrate resistance 708-2, which lowers the voltage on the inverting input of op amp 726. The lowered voltage at the input to the op amp 726 raises the voltage on the output of op amp 726, which raises the impedance of transistor 728. This increased impedance counters the effect of the spreading current from transistors 712 on the sensed current $I_{SNS}$. The spreading current causes an additional voltage drop across substrate resistance 708-1 that is not caused by current through transistors 710. The additional voltage drop lowers the drain voltage on the pilot FET 714; and this additional voltage drop alters the current through pilot FET 714, causing an erroneous current measurement.

The source of pilot FET 714 couples to the summing node 701 at the inverting input of op amp 726 through resistor 762 and transistor 776. The drains of transistors 710 connect to the summing node 702 at the non-inverting input of op amp 726 through resistor 794 and transistor 780. The sources of transistors 710 are coupled to the summing node 702 at the non-inverting input of op amp 726 through resistor 786. Because the drain voltages of the transistors 712 are at one input to the op amp 726 while the drain voltages of the transistors 710 are at the other input to the op amp 726, in this configuration, circuit 700 provides current spreading compensation for the measurement of the current in transistors 710 made using pilot FET 714.

As shown in FIGS. 7 and 8, resistors 730, 794, 796 and 798 are trimmable resistors. That is, the resistance value of these resistors can be adjusted after fabrication of the device. The amount of compensation provided by circuit 700 is sensitive to the ratio of the resistances of, for example, resistor 762 and resistor 730. Fabricating resistors with precision in integrated circuits is difficult. The values of the resistors obtained can vary with process variations. Further, other process dependent characteristics can affect the amount of compensation needed. Substrate thicknesses can vary. Transistor threshold voltage and transistor on resistance can vary. In this example embodiment, a cost effective solution is to allow for resistors 730, 794, 796 and 798 to be adjusted after device fabrication. In one embodiment, a register is provided to store a digital word indicating the desired value. The register value is used to select portions of a resistor network to form the desired value. After integrated circuit fabrication, testing can be done to determine the necessary trimming value. This value is then stored in a non-volatile register, such as an EPROM based register, to fix the value of the trimmed resistor. In other embodiments, the resistors may be laser trimmed or trimmed using a number of known trimming techniques. Alternative embodiments include laser trimmable resistors that can also be trimmed after manufacture. In another alternative embodiment, semiconductor process and circuit simulation tools can be used to model the resistors and fixed values can be used for the resistors.

In circuit 700, the resistor 792 can be internal to an integrated circuit including the other components. In an alternative embodiment, the resistor 792 can be coupled externally to an integrated circuit. Using an external sense resistor can provide additional accuracy in some applications. The remaining components of FIG. 7 can be formed on a single integrated circuit. In an example application, a voltage supply such as a battery can be coupled to the terminal Vbb. A load device can be coupled to the terminals 720, or 722, or both. Load devices can be a device receiving current from a battery. In FIG. 7, a current sink 738 and another current sink 740 represent example load devices.

FIG. 9 is a graph 900 showing the variation provided by different values of trimming the resistors. In FIGS. 7 and 8, this is resistor 730 or resistor 798. Computer simulations of the circuit 700 were performed. In the simulations, the resistor trim number included 5 bits and was altered from 00000 to 11111, increasing in value one bit at a time. Graph 900 only includes the extreme and central values of trim (00000, 10000 and 11111) for clarity. The current in channel 1 was set at 0.1 A and the current through channel 2 was varied from 0 to 30 A, as shown in the horizontal axis of FIG. 9. The central value of 10000 shown in line 920 provides the best results. The simulation demonstrates that the resistor adjustment can be raised as much as 17% and lowered as much as 13% when channel 2 carries 30 A. Five bits provides 64 resistance gradations. This level of adjustment allows sufficient adjustment to provide highly accurate compensation for current spreading errors.

Figure 10:
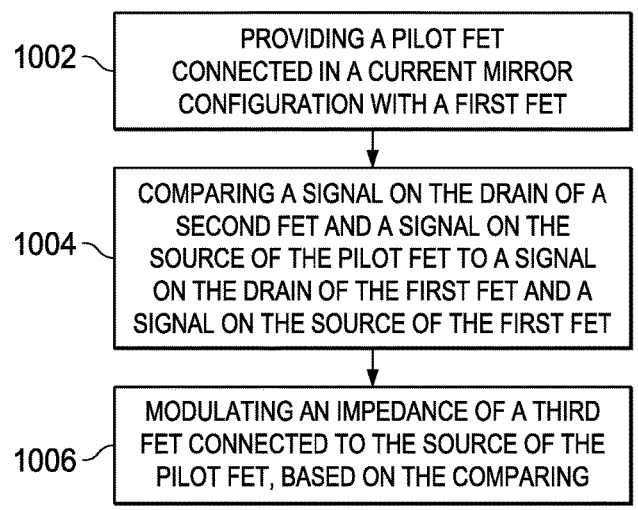
FIG. 10 is a flow diagram of an operation of a method embodiment.

FIG. 10 is a flow diagram illustrating a method embodiment corresponding to the operation of the embodiment circuit of FIGS. 7 and 8. In step 1002, a pilot FET is arranged as a current mirror with the first FET. Thus, the pilot FET reflects the current in the first FET, scaled by the relative device sizes. In step 1004, the signal on the drain of a second FET and a signal on the source of the pilot FET are compared to a signal on the drain of the first FET and a signal on the source of the first FET. The signal on the drain of the second FET provides an indication of current spreading from the second FET. The signal on the drain of the first FET counters the effect of the signal on the drain of the second FET, because high current in the first FET indicates that there is little current spreading. The method continues in step 1006, where the method modulates the impedance of a third FET connected to the source of the pilot FET based on the comparison of step 1004. By controlling the third FET, the method lowers the sensed current output of the pilot FET when current spreading occurs.

In an example embodiment, an integrated circuit includes: a first channel area having a first FET of a first conductivity type formed in a semiconductor substrate, the first FET having at least one source, at least one gate and a drain, the substrate providing a contact to the drain; and a second channel area having a second FET of the first conductivity type formed in the substrate and the second FET having at least one source, at least one gate and a drain, the substrate providing a contact to the drain of the second FET. The integrated circuit further includes a pilot FET formed in the first channel area having a drain coupled to the drain of the first FET, a gate coupled to the gate of the first FET, and a source; an op amp having an output, an inverting input and a non-inverting input; a first summing node coupled to the inverting input of the op amp and coupled to the source of the pilot FET and to the drain of the second FET; and a second summing node coupled to the non-inverting input of the op amp and coupled to the source of the first FET and to the drain of the first FET. In the integrated circuit, a third FET having a conductivity opposite the first and second FETs, has a gate coupled to the output of the op amp, a source coupled to the source of the pilot FET, and a drain coupled to a current sensing output terminal.

In a further example, in the integrated circuit the first and second FETs are N-channel FETs. In still another example in the integrated circuit the third FET which is a P-channel FET. In yet another example, the integrated circuit further includes a current measurement circuit having a first terminal coupled to the source of the third FET.

In still another example, the integrated circuit further includes a first resistor having a first terminal coupled to the drain of the second FET and a second terminal coupled to the first summing node; a second resistor having a first terminal coupled to the source of the pilot FET and a second terminal coupled to the first summing node; a third resistor having a first terminal coupled to the drain of the first FET and a second terminal coupled to the second summing node; a fourth resistor having a first terminal coupled to the source of the first FET and a second terminal coupled to the second summing node.

In yet another example, in the integrated circuit, the first resistor and the third resistor are trimmable.

In a further example, in the integrated circuit, the source of the pilot FET is coupled to the drain of the third FET by a first transistor; the second terminal of the first resistor is coupled to the first summing node through a second transistor; the first summing node is coupled to the inverting input of the op amp through a third transistor; the second terminal of the second resistor is coupled to the first summing node; the second terminal of the third transistor is coupled to the second summing node through a fourth transistor; the second terminal of the fourth resistor is coupled to the second summing node; and the second summing node is coupled to the non-inverting input of the op amp by a fifth transistor. In the integrated circuit, the first, second, third, fourth and fifth transistors each have a gate terminal selectively coupled to enable a current through the pilot FET to flow through the third FET.

In a further example, in the integrated circuit, at least the second, third, fourth and fifth transistors are extended drain transistors. In still a further example, in the integrated circuit, including a second pilot FET in the second channel area coupled to the second FET in a current mirror configuration. In a further example, in the integrated circuit, the first FET and the second FET are vertical power FET devices.

In another example embodiment, an apparatus includes: a first channel area having a first FET of a first conductivity type formed in a semiconductor substrate, the first FET having at least one source, a gate and a drain, the semiconductor substrate providing a contact to the drain, the semiconductor substrate further providing a terminal for receiving a drain potential; and a second channel area having a second FET of the first conductivity type formed in the semiconductor substrate, the second FET having at least one source, a gate and a drain, the semiconductor substrate providing a contact to the drain. The apparatus further includes a first pilot FET formed in the first channel area having a drain coupled to the drain of the first FET, a gate coupled to the gate of the first FET, and a source; and a second pilot FET formed in the second channel area having a drain coupled to the drain of the second FET, a gate coupled to the gate of the second FET, and a source. The apparatus also includes a third FET having a conductivity type opposite the first conductivity type, and having a source switchably coupled to one of the drain of the first pilot FET and the drain of the second pilot FET, and having a gate and a source coupled to a current sensing output terminal; an op amp having an output coupled to the gate of the third FET, an inverting input and a non-inverting input; a first summing node coupled to the inverting input of the op amp and being switchably coupled to one of the source of the first pilot FET and the source of the second pilot FET, and further being switchably coupled to one of the drain of the second FET and the drain of the first FET; and a second summing node coupled to the non-inverting input of the op amp and being switchably coupled to one of the source of the first FET and the source of the second FET, and further being switchably coupled to one of the drain of the first FET and the drain of the second FET.

In still another example, the apparatus includes: a first resistor having a first terminal coupled to the drain of the second FET and a second terminal coupled to the first summing node, the first resistor being trimmable; a second resistor having a first terminal coupled to the source of the first pilot FET and a second terminal coupled to the first summing node; a third resistor having a first terminal coupled to the source of the first FET and a second terminal coupled to the second summing node; and a fourth resistor having a first terminal coupled to the drain of the first FET and a second terminal coupled to the second summing node, the fourth resistor being trimmable.

In a further example, the apparatus further includes a fifth resistor having a first terminal coupled to the drain of the first FET and a second terminal coupled to the first summing node, the fifth resistor being trimmable; a sixth resistor having a first terminal coupled to the source of the second pilot FET and a second terminal coupled to the first summing node; a seventh resistor having a first terminal coupled to the source of the second FET and a second terminal coupled to the second summing node; and an eighth resistor having a first terminal coupled to the drain of the second FET via an eighth switch and a second terminal coupled to the second summing node, the eight resistor being trimmable.

In still another example, the apparatus includes a first load coupled to the source of the first FET and a second load coupled to the source of the second FET.

In yet a further example the apparatus includes the first and second FETs and the first and second pilot FETs that are N-channel FETs. In still another alternative example, the apparatus further includes a current measurement load having a first terminal coupled to the source of the third FET and a second terminal coupled to a second potential.

In an example method, a method includes measuring current in a first FET formed in a first channel area of a multichannel FET in a substrate, the first FET having at least one source, a gate and a drain, the multichannel FET having at least a second channel area having a second FET formed in the substrate and having at least one source, a gate and a drain, the substrate providing a contact to the drains of the first and second FETs, the method including: providing a pilot FET formed in the first channel area having a drain coupled to the drain of the first FET, a gate coupled to the gate of the first FET, and a source; comparing a signal including a sum of a voltage at the drain of the second FET and a voltage at the source of the pilot FET to a signal including a sum of a voltage at the drain of the first FET and a voltage at the source of the first FET; and modulating an impedance of a third FET coupled to the source of the pilot FET, based on the comparing.

In yet another example, the method further includes performing the comparing using an op amp having an inverting input and a non-inverting input, in which the signal on the drain of the second FET and the signal on the source of the pilot FET are provided to a first summing node coupled to the inverting input of the op amp, and the signal on the drain of the first FET and the signal on the source of the first FET are provided to a second summing node coupled to the non-inverting input of the op amp.

In another example, the method further includes the performing the modulating including determining whether a difference exists between voltages at the inverting input and the non-inverting input of the op amp; if a difference exists, increasing the impedance of the third FET by adjusting a gate voltage of the third FET; and if no difference exists, reducing the impedance of the third FET by adjusting the gate voltage of the third FET.

In an additional example, the method includes in which the signal on the drain of the second FET is provided to the first summing node via a first trimmable resistor and the signal on the source of the pilot FET are provided to the first summing node via a second resistor, the signal the signal on the drain of the first FET is provided to the second summing node via a third trimmable resistor and the signal on the source of the first FET are provided to the second summing node via a fourth resistor.

Modifications are possible in the described embodiments, and other embodiments are possible within the scope of the claims.

What is claimed is:

1. An integrated circuit comprising:
(a) a semiconductor substrate having a first channel region, a second channel region, an insulating region separating the first channel from the second channel, and a substrate drain region below the first channel, the insulating region, and the second channel;
(b) first transistors formed in the first channel region, a first transistor having a first source, a first gate, and a first drain, the first drain being coupled to the substrate drain region;
(c) second transistors formed in the second channel region, a second transistor having a second source, a second gate, and a second drain, the second drain being coupled to the substrate drain region;
(d) a first pilot transistor having a first pilot gate coupled to the first gate, a first pilot drain coupled to the first drain, and a first pilot source;
(e) comparing circuitry having an inverting input, a non-inverting input, and an output, the inverting input being coupled to the first pilot source and to the second drain, the non-inverting input being coupled to the first source and to the first drain; and
(f) an output transistor having a gate coupled to the output of the comparing circuitry, a drain, and a source.

2. The integrated circuit of claim 1 including first coupling circuitry selectively coupling the inverting input to the first pilot source and to the second drain, and second coupling circuitry selectively coupling the non-inverting input to the first source and to the first drain.

3. The integrated circuit of claim 2 in which the first coupling circuitry includes:
a first switch transistor having a source coupled to the second drain and a drain; and
a second switch transistor having a drain coupled to the drain of the first switch transistor and a source coupled to the inverting input.

4. The integrated circuit of claim 3 including a first resistor coupling the source of the first pilot transistor to the drain of the second switch transistor.

5. The integrated circuit of claim 2 in which the second coupling circuitry includes:
a third switch transistor having a source coupled to the non-inverting input and a drain; and
a fourth switch transistor having a drain coupled to the drain of the third switch transistor and a source coupled to the first drain.

6. The integrated circuit of claim 5 including a second resistor coupling the first source to the drain of the third switch transistor.

7. The integrated circuit of claim 1 including:
a second pilot transistor having a second pilot gate coupled to the second gate, a second pilot drain coupled to the second drain, and a second pilot source; and in which:
the inverting input is coupled to the second pilot source and to the first drain, and the non-inverting input is coupled to the second source and to the second drain.

8. The integrated circuit of claim 7 including third coupling circuitry selectively coupling the second pilot source and the first drain to the inverting input, and fourth coupling circuitry selectively coupling the second source and the second drain to the non-inverting input.

9. The integrated circuit of claim 8 in which the third coupling circuitry includes:
a fifth switch transistor having a source coupled to the first drain and a drain; and a sixth switch transistor having a drain coupled to the drain of the fifth switch transistor and a source couple to the non-inverting input.

10. The integrated circuit of claim 9 including a third resistor coupling the second pilot source to the drain of the sixth switch transistor.

11. The integrated circuit of claim 8 in which the fourth coupling circuitry includes:
    a seventh switch transistor having a source coupled to the inverting input and a drain; and
    an eighth switch transistor having a drain coupled to the drain of the seventh switch transistor and a source coupled to the second drain.

12. The integrated circuit of claim 5 including a fourth resistor coupling the second source to the drain of the seventh switch transistor.

13. The integrated circuit of claim 1 including:
    a ninth transistor coupled between the first pilot source and the drain of the output transistor;
    a tenth transistor coupled between the second pilot source and the drain of the output transistor;
    an output terminal; and
    an eleventh transistor coupled between the drain of the output transistor and the output transistor.

14. The integrated circuit of claim 1 in which the comparing circuitry is an operational amplifier.

15. A method of measuring current in a first transistor formed in a substrate, the substrate having two channel regions separated by an insulating region and having a drain region under the two channel regions and the insulating region, the first transistor is formed in one of the channel regions and having a first source, a first gate and a first drain, and including a second transistor formed in the other channel region, the second transistor having a second source, a second gate and a second drain, the drain region being coupled to the first drain and the second drain, the method comprising:
    providing a pilot transistor formed in the first channel region having a pilot drain coupled to the first drain, a pilot gate coupled to the first gate, and a pilot source;
    comparing a first signal including a sum of a voltage at the second drain and a voltage at the pilot source to a second signal including a sum of a voltage at the first drain and a voltage at the first source; and
    modulating an impedance of an output transistor coupled to the pilot source, based on the comparing.

16. The method of claim 15 in which the output transistor has a gate and the comparing includes:
    providing the first signal to an inverting input of an op amp;
    providing the second signal to a non-inverting input of the op amp;
    and
    providing an output of the op amp to the gate of the output transistor.

17. The method of claim 16, in which the modulating includes:
    determining whether a difference exists between voltages at the inverting input and the non-inverting input of the op amp;
    if a difference exists, increasing the impedance of the output transistor by adjusting a gate voltage of the output transistor; and
    if no difference exists, reducing the impedance of the output transistor by adjusting the gate voltage of the output transistor.

18. The method of claim 16 including:
    coupling the second drain to the inverting input via a first trimmable resistor;
    coupling the pilot source to the inverting input via a second resistor;
    coupling the first drain to the non-inverting input via a third trimmable resistor; and
    coupling the first source to the non-inverting input via a fourth resistor.

* * * * *